(12) United States Patent
Bae et al.

(10) Patent No.: US 7,886,433 B2
(45) Date of Patent: Feb. 15, 2011

(54) METHOD OF MANUFACTURING A COMPONENT-EMBEDDED PCB

(75) Inventors: Won-Cheol Bae, Pyeongtaek-si (KR); Je-Gwang Yoo, Yongin-si (KR); Sang-Chul Lee, Anyang-si (KR); Doo-Hwan Lee, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 522 days.

(21) Appl. No.: 12/007,795

(22) Filed: Jan. 15, 2008

(65) Prior Publication Data

US 2008/0171172 A1     Jul. 17, 2008

(30) Foreign Application Priority Data

Jan. 16, 2007    (KR) ...................... 10-2007-0004829

(51) Int. Cl.
*H05K 3/02*    (2006.01)
*H05K 3/10*    (2006.01)
(52) U.S. Cl. .............................. 29/846; 29/830; 29/837; 361/764
(58) Field of Classification Search ................... 29/830, 29/832, 834, 837, 846, 852; 174/260, 262; 361/761, 764; 438/108, 637
See application file for complete search history.

(56) References Cited

U.S. PATENT DOCUMENTS 5,875,100 A * 2/1999 Yamashita .................. 361/764

6,701,614 B2 * 3/2004 Ding et al. .................... 29/846

FOREIGN PATENT DOCUMENTS

| JP | 2004-134669 | 4/2004 |
|---|---|---|
| KR | 10-2006-0005840 | 1/2006 |
| KR | 10-2006-0026726 | 3/2006 |

OTHER PUBLICATIONS

Office Action mailed on Jan. 17, 2008 and issued in corresponding Korean Patent Application No. 10-2007-0004829.

* cited by examiner

*Primary Examiner*—Donghai D. Nguyen (57) ABSTRACT

A component-embedded PCB and a method of manufacturing the PCB are disclosed. Using a method that includes perforating a cavity in a core substrate; inserting a component in the cavity; stacking a film layer over the core substrate; forming at least one post by selectively leaving behind the film layer in correspondence to a position of at least one electrode of the component; covering an insulation layer over the core substrate such that the post penetrates the insulation layer to be exposed at a surface of the insulation layer; and forming at least one via hole by removing the post, can provide increased precision and finer pitch. Also, since laser is not used when processing the vias, damage to the component that may occur due to the laser is prevented. Furthermore, tolerance defects may be decreased, as well as defects caused by residue left after processing.

7 Claims, 15 Drawing Sheets

METHOD OF MANUFACTURING A COMPONENT-EMBEDDED PCB

CROSS-REFERENCE TO RELATED APPLICATIONS

This application claims the benefit of Korean Patent Application No. 10-2007-0004829 filed with the Korean Intellectual Property Office on Jan. 16, 2007, the disclosure of which is incorporated herein by reference in its entirety.

BACKGROUND

1. Technical Field

The present invention relates to a component-embedded PCB and a method of manufacturing the PCB.

2. Description of the Related Art

With advances in the electronics industry, there is a growing demand for smaller electronic products having greater functionality, and in particular, there is a need to decrease the thicknesses of the various parts equipped in a mobile terminal, to reduce its overall thickness. Also, with the number of services provided rapidly increasing in the field of mobile communication, various electronic components are being installed in the mobile terminal, such as a cell phone, etc.

Accordingly, in response to these trends towards greater functionality and smaller sizes, the mainstream was to use the so-called "IC-stacked" products, in which several components are stacked in one package. Recently, "package-stacked" products have also been produced, in which several package boards having one or more embedded components are stacked together.

In the case of a component-embedded printed circuit board according to the related art, an IC is mounted on the surface of a core substrate, and vias are formed that connect with the electrodes (Cu bumps) of the IC, in order to electrically connect the IC and the circuit pattern of the board. Here, a popular method of forming the vias is that of laser processing. However, laser processing entails a risk of the electrodes of the IC being damaged. Also, due to the limitations in terms of precision when forming via holes using a laser, lands may be required, which increase the pitch between via holes and decrease precision in electrically connecting the IC.

SUMMARY

An aspect of the invention is to provide a component-embedded PCB, and a method of manufacturing the PCB, which allows increased precision and finer pitch, and in which tolerance defects and damaging of the component by laser processing can be reduced.

One aspect of the invention provides a method of manufacturing a printed circuit board having an embedded component. The method includes: perforating a cavity in a core substrate; inserting a component in the cavity; stacking a film layer over the core substrate; forming at least one post by selectively leaving behind the film layer in correspondence to a position of at least one electrode of the component; covering an insulation layer over the core substrate such that the post penetrates the insulation layer to be exposed at a surface of the insulation layer; and forming at least one via hole by removing the post.

Here, the core substrate used may be such that has an inner layer circuit formed on at least one surface. Also, before inserting the component, the method may further include closing one side of the cavity by stacking a tape over one side of the core substrate, in which case inserting the component can include securing the component to the tape.

The film layer can be made of a photosensitive dry film, while forming the post can include removing portions of the dry film other than those to be left behind, to form the post, by exposing and developing the dry film.

The method may include forming a circuit pattern on a surface of the insulation layer, after covering the insulation layer. In such cases, the component can be electrically connected with the circuit pattern by plating the via hole or by filling a conductive paste in the via hole.

Another aspect of the invention provides a component-embedded printed circuit board that includes: a core substrate; a cavity formed in the core substrate; a component held in the cavity; an insulation layer, which is stacked on a surface of the core substrate, and which covers the component; and a via hole formed by removing a portion of the insulation layer in correspondence with a position of an electrode of the component, where the via hole is formed by removing a post attached to a position of the electrode of the component such that the post penetrates the insulation layer and is exposed at a surface of the insulation layer.

A circuit pattern may be formed on a surface of the insulation layer, and the circuit pattern can be electrically connected with the component through the via hole. A metal layer can be plated onto an inner wall of the via hole, or a conductive paste can be filled in the via hole, for electrical connection with the component.

Additional aspects and advantages of the present invention will be set forth in part in the description which follows, and in part will be obvious from the description, or may be learned by practice of the invention.

DETAILED DESCRIPTION

The component-embedded PCB, and method of manufacturing the PCB, according to certain embodiments of the invention will be described below in more detail with reference to the accompanying drawings. Those components that are the same or are in correspondence are rendered the same reference numeral regardless of the figure number, and redundant explanations are omitted.

Figure 1A:
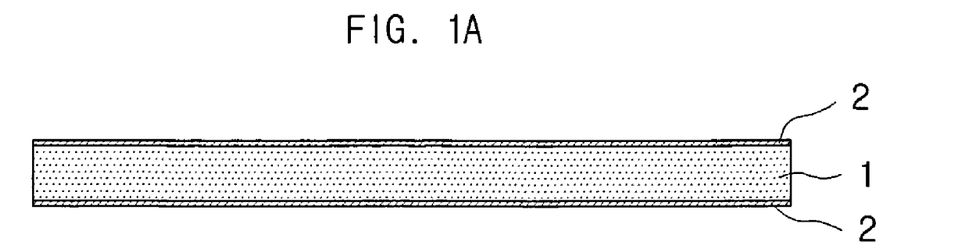
FIG. 1A and FIG. 1B are cross-sectional views of a core substrate according to an embodiment of the present invention.
Figure 1B:
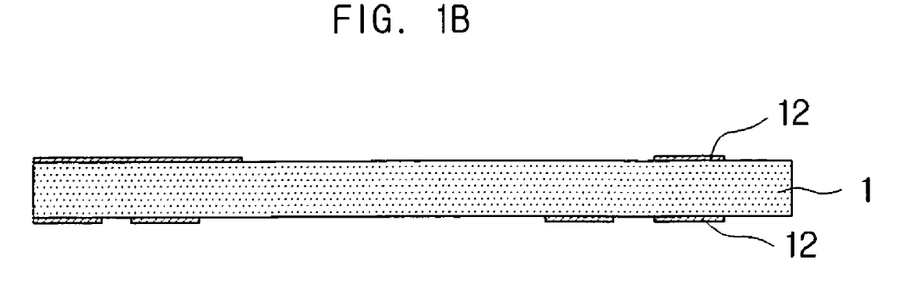

FIG. 1A and FIG. 1B are cross-sectional views of a core substrate according to an embodiment of the present invention. In FIGS. 1A and 1B, there are illustrated a core substrate 1, metal layers 2, and circuit patterns 12.

The core substrate 1 may serve as the substrate in which the component can be embedded, and as such, a cavity can be formed in the core substrate 1 for inserting the component. The cavity will be described in more detail later. When using a core substrate that has two metal layers 2 stacked thereon, an example of which may include a copper clad laminate, inner layer circuits 12 can be formed also on the surfaces of the core substrate, to manufacture a multi-layered printed circuit board having embedded components. That is, from the core substrate 1 having metal layers 2 stacked on, as illustrated in FIG. 1A, the metal layers 2 may be etched to form inner layer circuits 12, as illustrated in FIG. 1B.

Figure 2:
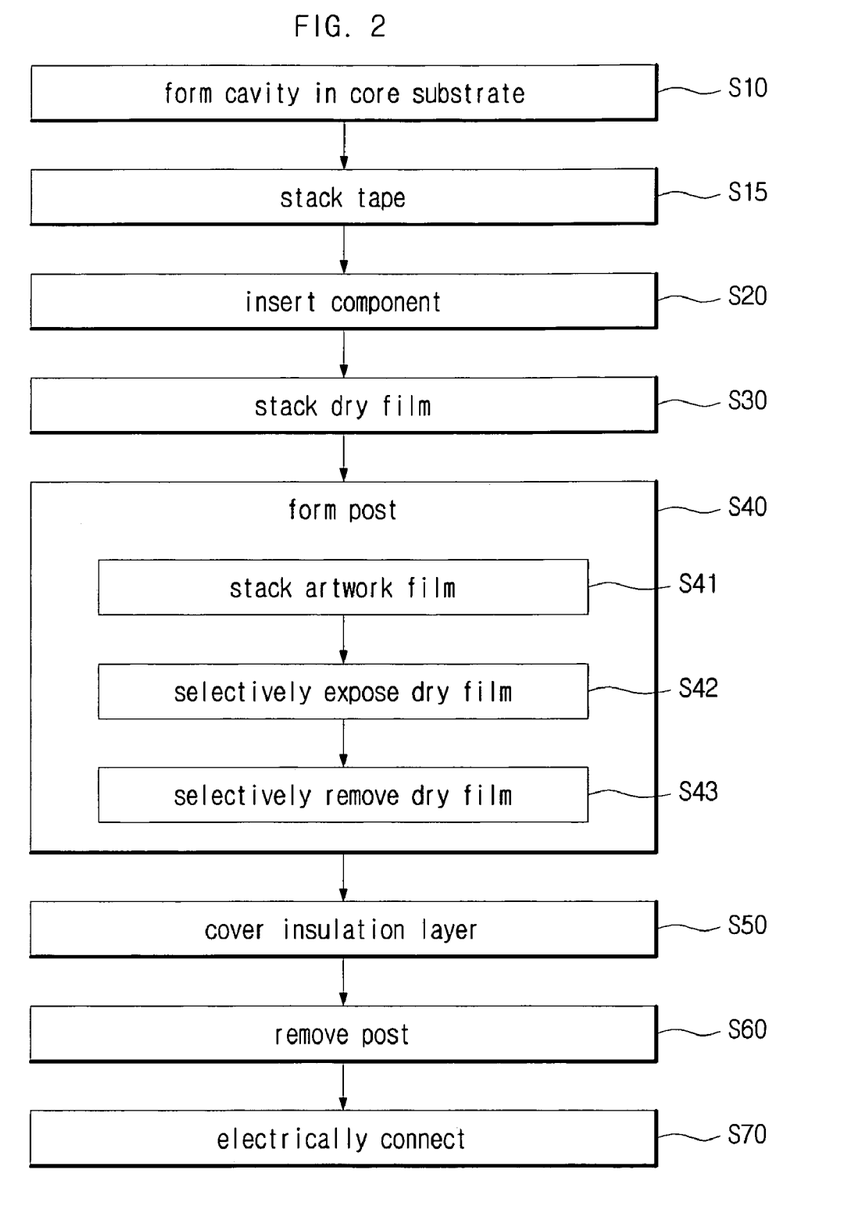
FIG. 2 is a flowchart illustrating a method of manufacturing a component-embedded printed circuit board according to an embodiment of the present invention.

A component-embedded PCB according to this embodiment can be manufactured by embedding a component into a core substrate thus formed. FIG. 2 is a flowchart illustrating a method of manufacturing a component-embedded printed circuit board according to an embodiment of the present invention, and FIG. 3A through FIG. 3H are cross-sectional views representing a flow diagram for a method of manufacturing a component-embedded printed circuit board according to an embodiment of the present invention. In FIGS. 3A to 3H are illustrated a core substrate 1, a cavity 11, inner layer circuits 12, a tape 13, a component 14, electrodes 15, a dry film 16, posts 16', an artwork film 17, and an insulation layer 18.

First, a cavity 11 may be formed in a core substrate 1 (S10). While it is not absolutely necessary that an inner layer circuit 12 be formed on one or both surfaces of the core substrate 1, it can be desirable to form the inner layer circuits 12, as, described with reference to FIG. 1B.

Figure 3A:
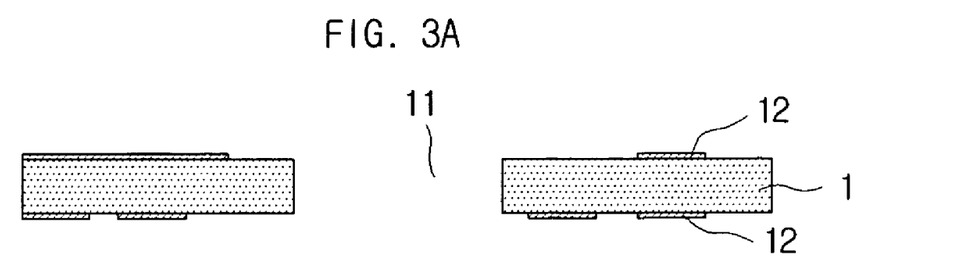
FIG. 3A, FIG. 3B, FIG. 3C, FIG. 3D, FIG. 3E, FIG. 3F, FIG. 3G, and FIG. 3H are cross-sectional views representing a flow diagram for a method of manufacturing a component-embedded printed circuit board according to an embodiment of the present invention.
Figure 3B:
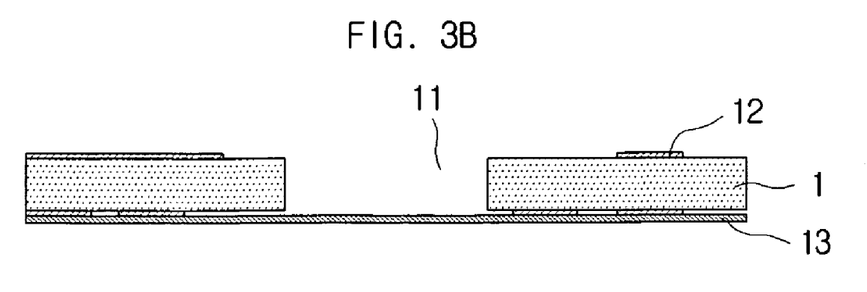

The cavity 11 may be a sort of hole formed when perforating the core substrate 1 by laser or mechanical drilling, etc., and may provide a space in which to insert a component 14. FIG. 3A illustrates a cavity 11 formed in a core substrate 1 having inner layer circuits 12 according to this particular embodiment.

Next, a component 14 may be inserted in the cavity 11 perforated in the core substrate 1 (S20). The component 14 in this embodiment may include any of various components that can be embedded in a printed circuit board and electrically connected with the circuit patterns to perform certain electrical functions. Examples of such may include transistors, diodes, solar cells, and Josephson components, etc.

Here, in order to secure the component 14 after inserting the component 14 in the cavity 11 perforated in the core substrate 1, a tape 13 may be attached to the core substrate in which the cavity 11 is perforated (S15) to close one side of the core substrate 1. Attaching the tape 13 to one side of the core substrate 1 can result in the tape 13 blocking off one side of the cavity 11, so that the component 14 inserted into the cavity 11 may be attached to the tape 13. That is, the tape 13 may serve as a support for the component 14, to aid in readily securing the component 14 (see FIG. 3B).

Figure 3C:
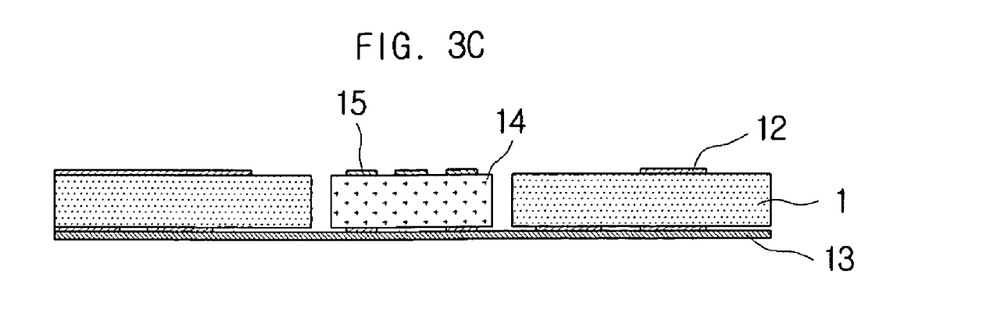
Figure 3D:
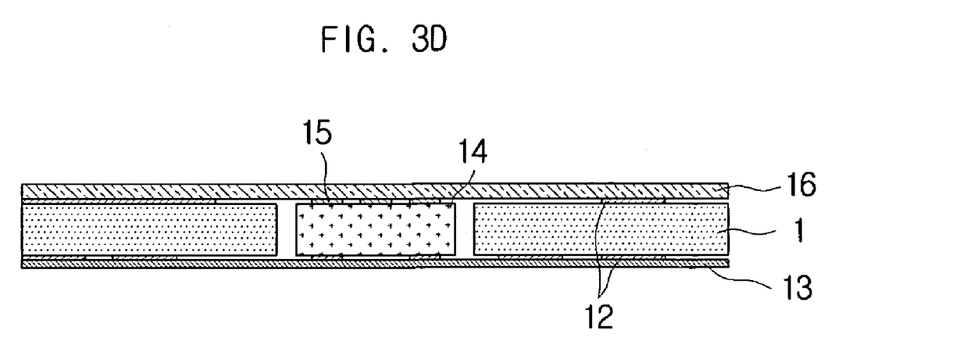

After inserting the component 14 in the cavity 11, a film layer, such as a dry film, etc., may be stacked over a position where the component 14 is embedded (S30, see FIGS. 3C and 3D). The film layer can be made of a material that can be selectively removed, a typical example of which is dry film 16 made of a photosensitive material. In this particular embodiment, the descriptions will refer to dry film 16 as an example of the film layer.

The dry film 16 may be made of a photosensitive material and may be such that can have particular positions be selectively removed or left behind by exposure and development processes. As such, in this embodiment, the dry film 16 may be stacked on the position where the component 14 is embedded. Then, the dry film 16 may be left behind only in the positions of the electrodes 15 of the component 14, and the other portions may be removed, to form "posts 16'," which will be described in more detail later.

Of course, other processes besides the exposure and development processes can be employed in forming the posts 16', which may include electrical and/or chemical processes. In such cases, other materials that can be selectively left behind or removed can be used instead of the dry film 16, according to the process employed.

Next, the posts 16' may be formed (S40). The posts 16' may be formed on the electrodes 15 of the component 14 to make via holes that may act as paths for connecting the electrodes 15 of the component 14 with the exterior of the component-embedded PCB. The posts 16' may be formed by selectively leaving behind the dry film 16 in the positions of the electrodes 15 of the component 14.

Dry film 16 can be divided into negative types and positive types. When a negative type dry film is exposed to rays, the exposed portions are hardened, so that when dissolved in a developer, the hardened portions are left behind while the other portions are removed.

Conversely, for a positive type dry film, the portions other than those exposed to rays are hardened, so that the portions exposed to the rays are removed by a developer.

While this particular embodiment is described for the case of using a negative type dry film, it is to be appreciated that it is possible to use a positive type just as well.

The posts 16' can be formed by the following example procedures.

First, an artwork film may be stacked (S41). The artwork film may be a film in which the position of the circuit pattern or via holes are printed, and may serve to selectively transmit rays, such as ultraviolet rays. Since this particular embodiment uses a negative type dry film 16, to leave behind the dry film 16 in the positions of the via holes, an artwork film may be used that allows the transmission of ultraviolet rays, etc., into the positions of the via holes (see FIG. 3E). In cases where selective exposure is possible without using an artwork film, the operation of stacking the artwork film can be omitted.

Figure 3E:
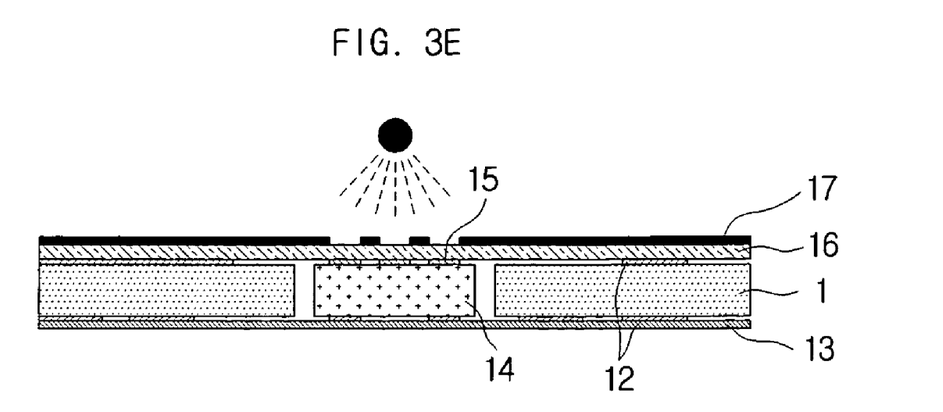
Figure 3F:
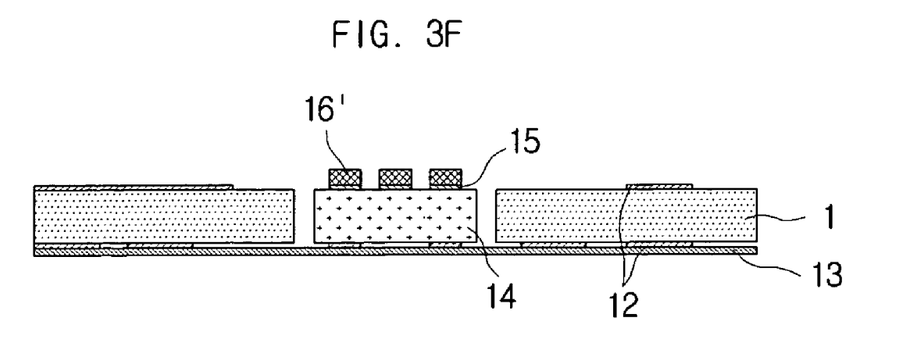

After stacking the artwork film, the dry film 16 can be selectively exposed (S42), where exposing here is for hardening the dry film 16. When rays such as ultraviolet rays, etc., are irradiated onto a dry film 16, the exposed portions or the unexposed portions may be hardened. FIG. 3E illustrates how an artwork film 17 can be used to harden only the portions of the dry film corresponding to the electrodes 15 during the exposure process.

The next operation may be that of developing. Developing refers to removing portions of the dry film 16 other than the portions hardened by the exposing operation, using a developer (S43). As the dry film in the positions of the via holes may be hardened, applying the developer can result in the posts 16' being formed in the positions of the via holes (see FIG. 3F).

After forming the posts 16' (S40), an insulation layer 18 may be stacked to cover the core substrate (S50). A material such as ABF (Ajinomoto build-up film), etc., can be used. ABF (Ajinomoto build-up film) is a sort of adhesive sheet made of an insulating material. As such, the insulation layer 18 can be stacked on the core substrate 1 by applying ABF over the core substrate 1 and hardening.

Figure 3G:
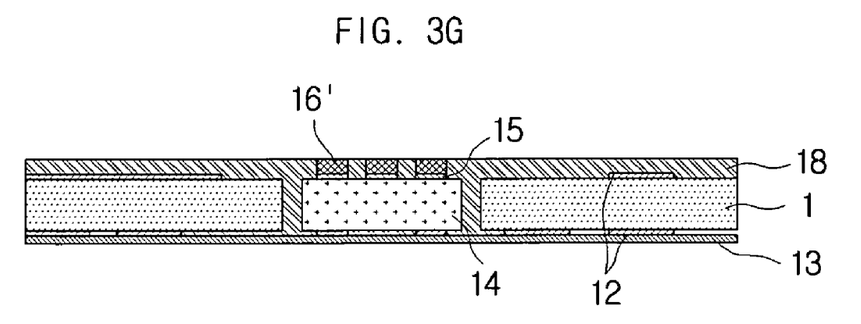

By having the portions where the posts 16' are formed not be covered by the insulation layer 18, but instead be exposed at the surface of the insulation layer 18, the via holes may be formed in a subsequent operation by removing the posts 16' (see FIG. 3G). For this, the level of the posts 16' can be higher than or at least be even with the level of the insulation layer 18.

Figure 3H:
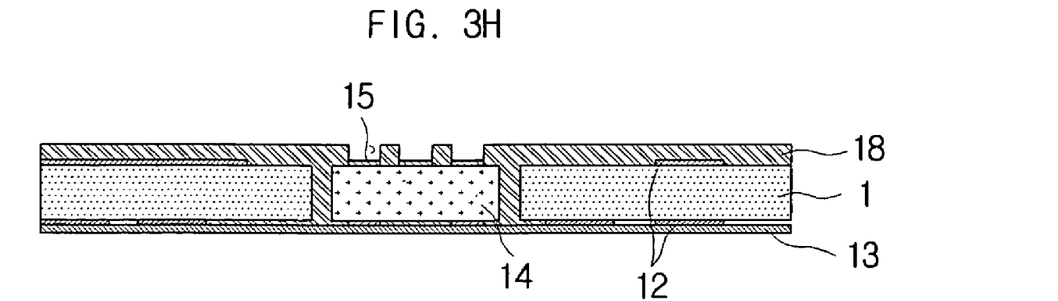

After the insulation layer 18 is stacked, the posts 16' may be removed (S60). Removing the posts 16' formed by hardening the dry film 16 may result in via holes being formed in the insulation layer 18, thus forming paths for connecting to the electrodes 15 of the component 14. FIG. 3H illustrates via holes formed in the insulation layer 18 by removing the posts 16'.

On the surface of the insulation layer 18, a circuit pattern may be formed, or other parts may be mounted. In cases where electrical connection is required between the embedded component 14 and a circuit pattern, or where the component 14 is to be electrically connected with another part, a process may be performed for implementing the transmission of electrical signals through the via holes. To this end, a particular mode of processing may be applied to the via holes formed by removing the posts 16', to electrically connect the component 14 with the circuit pattern, etc., on the insulation layer 18 (S70). This will be further described below with reference to FIG. 4 and FIG. 5.

Figure 4:
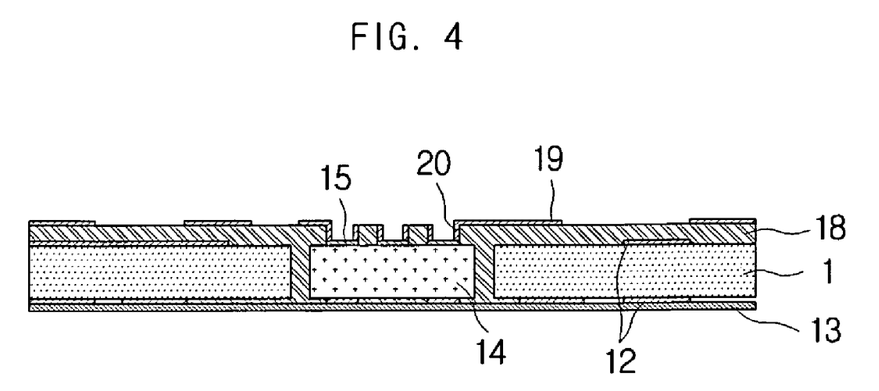
FIG. 4 is a cross-sectional view illustrating a method of electrically connecting via holes according to an embodiment of the present invention.

FIG. 4 is a cross-sectional view illustrating a method of electrically connecting via holes according to an embodiment of the present invention. In FIG. 4 are illustrated a core substrate 1, inner layer circuits 12, a component 14, electrodes 15, an insulation layer 18, a circuit pattern 19, and a plating layer 20.

In electrically connecting the circuit pattern 19 formed over the insulation layer 18 with the component 14, one method that can be used is to plate the inner walls of the via holes with metal. As the material used for plating is typically a metal, electrical signals can be transferred through the plating layer 20, whereby electrical conduction can be implemented between the embedded component 14 and the circuit pattern 19 on the surface or other parts not included in the board.

Figure 5:
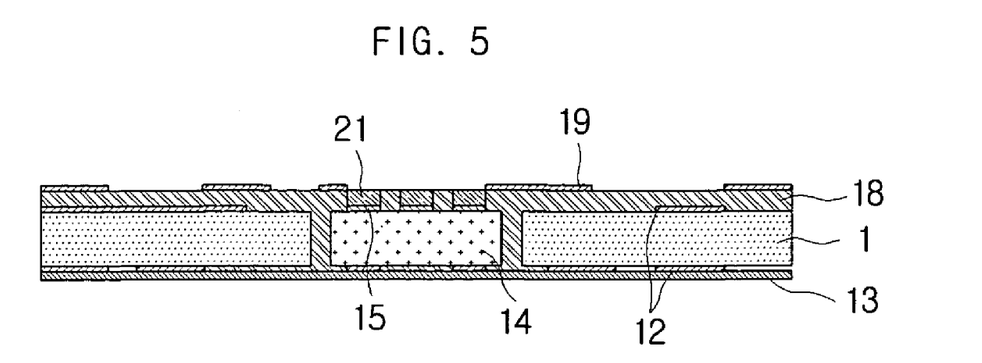
FIG. 5 is a cross-sectional view illustrating a method of electrically connecting via holes according to another embodiment of the present invention.

FIG. 5 is a cross-sectional view illustrating a method of electrically connecting via holes according to another embodiment of the present invention. In FIG. 5 are illustrated a conductive core substrate 1, inner layer circuits 12, a component 14, electrodes 15, an insulation layer 18, a circuit pattern 19, and conductive paste 21. One method of implementing electrical conduction in the via holes is to fill in the via holes with conductive paste 21.

The following descriptions will disclose embodiments of a PCB having an embedded component according to another aspect of the invention. FIG. 4 and FIG. 5 illustrate embodiments of the component-embedded PCB according to an aspect of the invention. A component-embedded PCB according to such embodiments may include a component 14 inserted in a cavity 11 formed in a core substrate 1, with via holes formed in correspondence to the electrodes 15 of the component 14 for interlayer electrical conduction between the component 14 and the circuit pattern 19.

A component-embedded PCB of the present embodiment may include a core substrate 1, a component 14 held in a cavity 11 formed in the core substrate, an insulation layer 18 stacked on a surface of the core substrate 1 to cover the component 14, and via holes formed by removing portions of the insulation layer in correspondence to positions of the electrodes 15 of the component (see FIG. 4 and FIG. 5). Here, the via holes may be formed by removing posts 16', which may be attached to the positions of the electrodes 15 of the component 14 such that the posts 16' penetrate the insulation layer 18 to be exposed at the surface, as illustrated in FIGS. 3G and 3H.

The method of forming via holes using posts 16' can reduce the sizes of the via holes with a higher degree of precision compared to conventional processing methods using laser, and can reduce the level of error in terms also of accurate positioning. As such, finer pitch can be implemented, allowing more densely positioned via holes and circuit patterns 19.

Furthermore, whereas laser processing can cause damage to the electrodes 15 of the component 14, the method of using posts may not cause damage to the electrodes 15 and may eliminate defects that would have been caused by residue resulting from laser processing.

Figure 6:
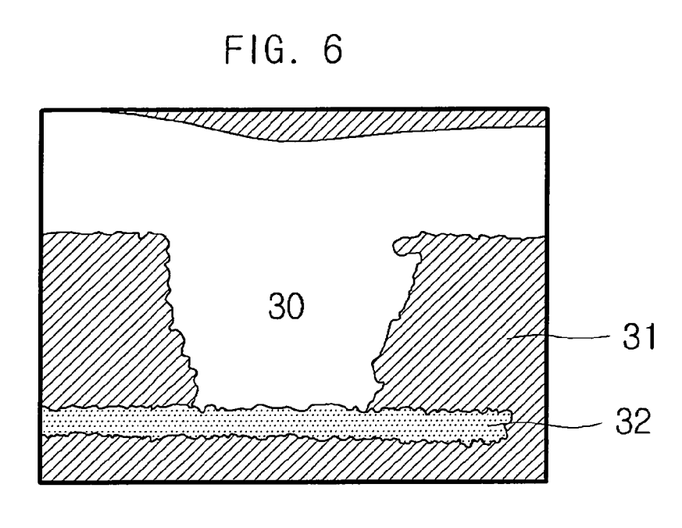
FIG. 6 is a cross-sectional view illustrating the shape of a via hole formed by a laser processing method according to the related art.

FIG. 6 is a cross-sectional view illustrating the shape of a via hole formed by a laser processing method according to the related art. In FIG. 6 are illustrated conductive paste 30, an insulation layer 31, and an electrode 32. The cross section of an actual via hole formed by laser processing is generally shaped as a trapezoid. As the size of the via hole at the side of the electrode 32 is formed smaller than the size of the via hole at the surface of the insulation layer 31, the via hole at the surface of the insulation layer 31 is bigger than the actually required sized, while the narrow via hole at the side of the electrode 32 can cause faulty connections.

However, the processing of vias using posts can provide a higher degree of accuracy and reduced via hole sizes compared to processing using laser, to allow finer pitch, and can prevent damage to the electrodes of the component.

Figure 7:
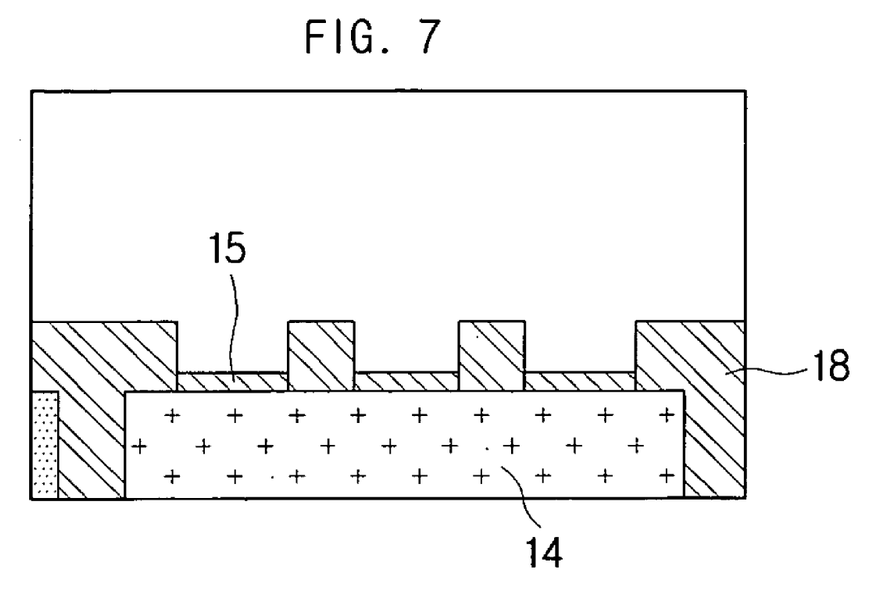
FIG. 7 is a cross-sectional view illustrating the shapes of via holes in a component-embedded printed circuit board according to an embodiment of the present invention.

FIG. 7 is a cross-sectional view illustrating the shapes of via holes in a component-embedded printed circuit board according to an embodiment of the present invention. The via holes formed in positions of the electrodes 15 of the component 14 that penetrate the insulation layer 18 can maintain the same shape obtained after removing the posts, and may thus provide an advantage in interlayer electrical conduction.

A component-embedded PCB of a multi-layer structure can be formed by forming circuit patterns on the surfaces of insulation layers. Here, examples of methods for implementing electrical conduction between the component 14 and circuit patterns 19 may include plating the inner walls of the via holes with metal (see FIG. 4), or filling the via holes with conductive paste 21 (see FIG. 5).

As set forth above, certain embodiments of the invention allow increased precision and finer pitch, and since laser is not used when processing the vias, damage to the component that may occur due to the laser is prevented. Furthermore, tolerance defects may be decreased, as well as defects caused by residue left after processing.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board having an embedded component, the method comprising:

perforating a cavity in a core substrate;

inserting a component in the cavity;

stacking a film layer over the core substrate and the component in the cavity;

forming at least one post by selectively leaving behind a portion of the film layer in correspondence to a position of at least one electrode of the component while removing other portion of the film layer;

covering an insulation layer over the core substrate such that the post penetrates the insulation layer and exposes at a surface of the insulation layer; and forming at least one via hole by removing the post to expose the electrode of the component.

2. The method of claim 1, wherein an inner layer circuit is formed on at least one surface of the core substrate.

3. The method of claim 1, further comprising, before inserting the component:

closing one side of the cavity by stacking a tape over one side of the core substrate, wherein inserting the component comprises:

securing the component to the tape.

4. The method of claim 1, wherein the film layer is a photosensitive dry film, and wherein forming the post comprises:

removing portions of the dry film other than those to be left behind by exposing and developing the dry film.

5. The method of claim 1, further comprising, after covering the insulation layer:

forming a circuit pattern on a surface of the insulation layer.

6. The method of claim 5, further comprising, after forming the via hole:

electrically connecting the component with the circuit pattern by plating the via hole.

7. The method of claim 5, further comprising, after forming the via hole:

electrically connecting the component with the circuit pattern by filling a conductive paste in the via hole.

* * * * *